(12) United States Patent
Ikuma et al.

(10) Patent No.: US 11,525,971 B2
(45) Date of Patent: Dec. 13, 2022

(54) INSERTION/REMOVAL ERROR PREVENTION SYSTEM

(71) Applicant: Nippon Telegraph and Telephone Corporation, Tokyo (JP)

(72) Inventors: Yuichiro Ikuma, Tokyo (JP); Takeshi Seki, Tokyo (JP); Takafumi Fukatani, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 17/252,364

(22) PCT Filed: Jun. 17, 2019

(86) PCT No.: PCT/JP2019/023870
§ 371 (c)(1),
(2) Date: Dec. 15, 2020

(87) PCT Pub. No.: WO2019/244832
PCT Pub. Date: Dec. 26, 2019

(65) Prior Publication Data
US 2021/0191056 A1 Jun. 24, 2021

(30) Foreign Application Priority Data
Jun. 18, 2018 (JP) .............................. JP2018-115646

(51) Int. Cl.
*G02B 6/42* (2006.01)
*G02B 6/36* (2006.01)
(Continued)

(52) U.S. Cl.
CPC ......... *G02B 6/4256* (2013.01); *G02B 6/3616* (2013.01); *G02B 6/4284* (2013.01); *G06F 1/182* (2013.01); *G06F 3/041* (2013.01)

(58) Field of Classification Search
CPC .. G02B 6/4256; G02B 6/3616; G02B 6/4284; G06F 1/182; G06F 3/041
(Continued)

(56) References Cited

U.S. PATENT DOCUMENTS

2014/0253489 A1* 9/2014 Osoinach ................ G06F 3/041
345/174
2015/0292939 A1* 10/2015 Saitoh .................... G02B 6/262
385/130

FOREIGN PATENT DOCUMENTS

| JP | 2008-242718 | 10/2008 |
|----|-------------|---------|
| JP | 2012-142833 | 7/2012 |

(Continued)

*Primary Examiner* — Jerry M Blevins
(74) *Attorney, Agent, or Firm* — Fish & Richardson P.C.

(57) ABSTRACT

An incorrect insertion and removal prevention system that can prevent an operator from incorrectly selecting a port to be operated without sacrificing the port mounting density is described.

An optical transmission device 100 of the incorrect insertion and removal prevention system includes a plurality of ports 101 for transmitting and receiving an external signal, a touch sensor 102 installed in each of the ports 101 to detect a contact of the human body, a control unit 110 for causing a display unit 130 to display information about the port 101 corresponding to the touch sensor 102 detecting the contact of the human body, a storage unit 120 for storing information for distinguishing each port 101, and the display unit 130 for displaying the information for distinguishing each port 101.

13 Claims, 10 Drawing Sheets

(51) Int. Cl.
*G06F 1/18* (2006.01)
*G06F 3/041* (2006.01)

(58) Field of Classification Search
USPC .......................................................... 385/92
See application file for complete search history.

(56) References Cited

FOREIGN PATENT DOCUMENTS

| | | |
|---|---|---|
| JP | 2013-085707 | 5/2013 |
| JP | 2014-142753 | 8/2014 |
| JP | 2014-174996 | 9/2014 |
| JP | 2016-129111 | 7/2016 |

* cited by examiner (a)

(b)

(c)

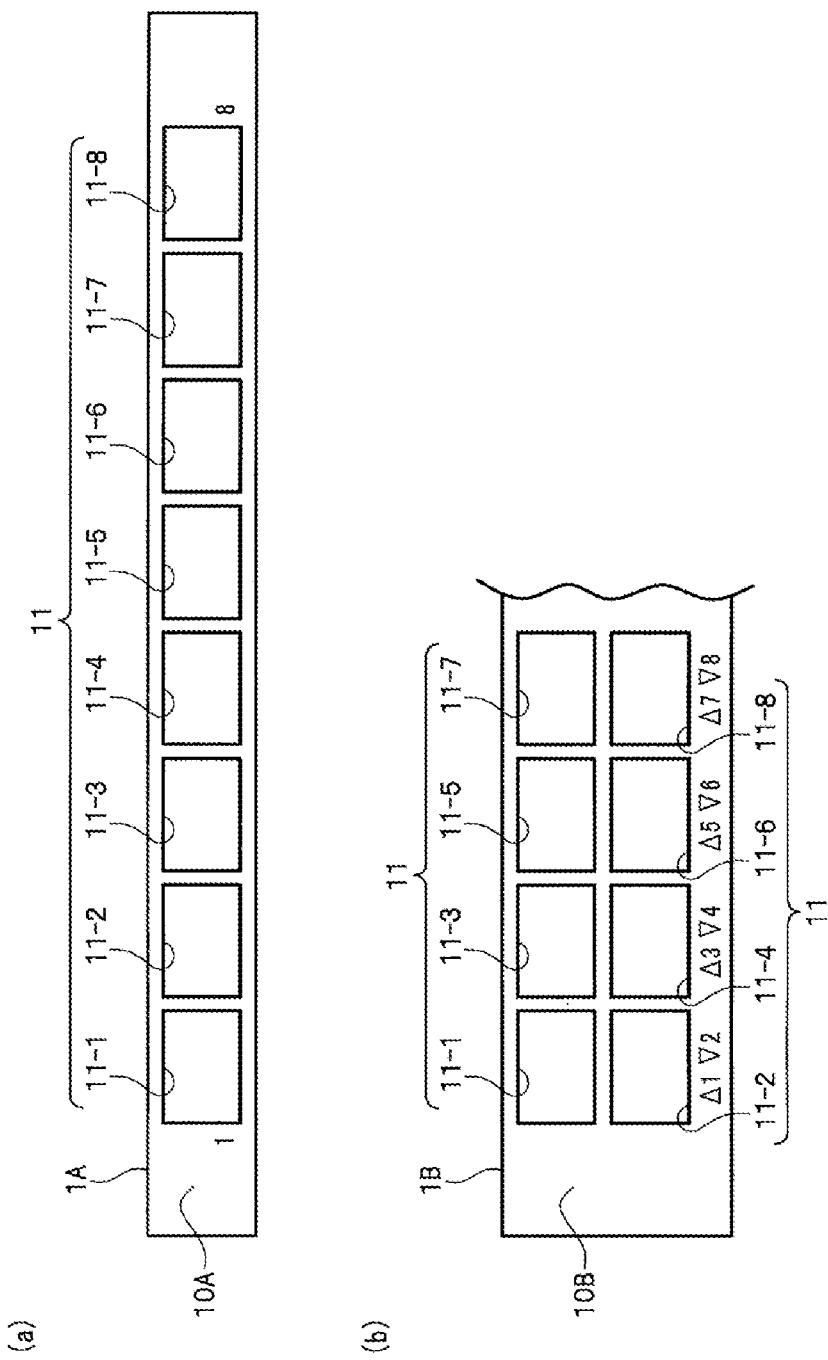

INSERTION/REMOVAL ERROR PREVENTION SYSTEM

CROSS-REFERENCE TO RELATED APPLICATIONS

This application is a National Stage application under 35 U.S.C. § 371 of International Application No. PCT/JP2019/023870, having an International Filing Date of Jun. 17, 2019, which claims priority to Japanese Application Serial No. 2018-115646, filed on Jun. 18, 2018. The disclosure of the prior application is considered part of the disclosure of this application, and is incorporated in its entirety into this application.

TECHNICAL FIELD

The present invention relates to an incorrect insertion and removal prevention system.

BACKGROUND ART

With the miniaturization of electronic devices in recent years, the mounting density of external input and output terminals (hereinafter referred to as ports) for connecting communication cables and the like has increased. When a large number of ports are disposed in a single device, human errors are likely to occur. For example, an operator connects a cable to an incorrect port or removes an incorrect cable. In particular, in case of an optical fiber communication equipment that performs large capacity communication, removing an incorrect cable causes communication interruption in a wide area, generating a significant problem.

A number is typically provided near the port so that the operator can recognize the correct port, but it does not always make it easy to clearly identify the port.

FIG. 10 illustrates ports laterally arranged in a rear portion of a cabinet of a conventional electronic device, FIG. 10(a) illustrates an example in which port numbers are indicated near the leading and trailing ports, and FIG. 10(b) illustrates an example in which the ports are vertically arranged and port numbers are described with abbreviations.

As illustrated in FIG. 10(a), a rear portion 10A of the cabinet of an electronic device 1A is provided with laterally-arranged eight ports 11-1 to 11-8. On the left side of the port 11-1, a number "1" of the port 11-1, and on the right side of the port 11-8, a number "8" of the port 11-8 are, for example, printed, engraved, or affixed as a seal member (hereinafter, referred to as print). In the example of FIG. 10(a), the eight ports 11-1 to 11-8 are provided. In order to improve the mounting density, a gap between the eight ports 11-1 to 11-8 are not enough for printing a character. Furthermore, in order to reduce the height of the device, enough space for printing is not provided above and below the ports. Thus, the port numbers are only printed near the port 11-8 and the port 11-1 at both ends. In this case, the intermediate ports 11-2 to 11-7 have to be counted from either end, and may easily be miscounted.

As illustrated in FIG. 10(b), the eight ports 11-1 to 11-8 are arranged in upper and lower rows in a rear portion 10B of a cabinet of an electronic device 1B. Upper and lower port numbers are collectively printed below the respective ports, and the Δ mark indicates an odd number and ∇ mark indicates an even number. However, identification using such marks is unclear and thus, the port numbers may be misread.

In addition, as a problem common to the examples of FIGS. 10(a) and 10(b), when the electronic device 1A and the electronic device 1B are installed at a position near user's foot, for example, characters in the rear portions 10A, 10B of the cabinet are difficult to see from the operator, and even easier to misread.

In addition, even when the operator can visually recognize a correct port, the operator may once take his/her eyes off the port when handling the cable to be inserted. Thus, the operator may lose sight of the correct port.

Patent Literature 1 describes an electronic device including a lighting switch unit for assigning a light emitting unit to each of a plurality of external input and output terminals for connecting to an external device, and illuminating the light emitting unit corresponding to an external input and output terminal selected from the plurality of external input and output terminals. The electronic device described in Patent Literature 1 illuminates an LED disposed near the port by remote control such that the operator can recognize the correct port.

CITATION LIST

Patent Literature

Patent Literature 1: JP 2008-242718 A

SUMMARY OF THE INVENTION

Technical Problem

However, in the electronic device described in Patent Literature 1, the positional relationship between the LED installed near the port and the corresponding port is not always clear. In this regard, the problem with textual printing in prior art as illustrated in FIGS. 7A and 7B still remains, and the port may be misidentified. Additionally, there is a problem in that a space for installing the LEDs on the front face of the device must be ensured.

In light of the foregoing, an object of the present invention is to provide an incorrect insertion and removal prevention system that can prevent the operator from incorrectly selecting a port to be handled without sacrificing the port mounting density.

Means for Solving the Problem

In order to solve the problems described above, the first aspect of the invention provides an incorrect insertion and removal prevention system including: an electronic device having a plurality of input and output ports for transmitting and receiving an external signal; a touch sensor installed in each of the plurality of the input and output ports, the touch sensors being configured to detect a contact of a human body; a display unit configured to display information for distinguishing each of the plurality of the input and output ports; and a control unit configured to cause the display unit to display the information about the input and output port corresponding to the touch sensor detecting the contact of the human body.

In this manner, even when a large number of ports are disposed in one electronic device, human errors such as the operator connecting the cable to the incorrect port or removing the incorrect cable can be prevented. In addition, the operator can be prevented from incorrectly selecting the port to be operated without sacrificing the port mounting density.

The second aspect of the invention provides the incorrect insertion and removal prevention system according to the first aspect, wherein the touch sensor detects the contact of the human body via a conductive component that contacts the human body.

In this manner, the contact of the human body can be detected directly or via the conductive component that contacts the human body (for example, a connector or a cap for closing the port).

The third aspect of the invention provides the incorrect insertion and removal prevention system according to the first aspect, wherein each of the input and output ports of the electronic device is arranged on a face of a cabinet, and the display unit is disposed on the face of the cabinet.

In this manner, since the installation space for the display unit only occupies a part of the cabinet, the face of the cabinet can be effectively utilized, thereby further increasing the port mounting density.

The fourth aspect of the invention provides the incorrect insertion and removal prevention system according to the first aspect, further including: a monitor device configured to monitor the electronic device; and a notification unit configured to notify the monitor device of a signal from the touch sensor.

In this manner, the local and remote personnel can work in coordination performing double check, thereby reducing incorrect operations.

Effects of the Invention

According to the present invention, it is possible to provide an incorrect insertion and removal prevention system that can prevent an operator from incorrectly selecting a port to be operated without sacrificing the port mounting density.

BRIEF DESCRIPTION OF DRAWINGS

FIG. 10 are diagrams illustrating ports laterally arranged in a rear portion of a cabinet of a conventional electronic device, FIG. 10(*a*) illustrates an example in which port numbers are indicated near the leading and trailing ports, and FIG. 10(*b*) illustrates an example in which the ports are vertically arranged and port numbers are described with abbreviations.

DESCRIPTION OF EMBODIMENTS

An incorrect insertion and removal prevention system according to an embodiment of the present invention (referred to as "present embodiment" below) will be described below with reference to drawings.

First Embodiment

Figure 1:
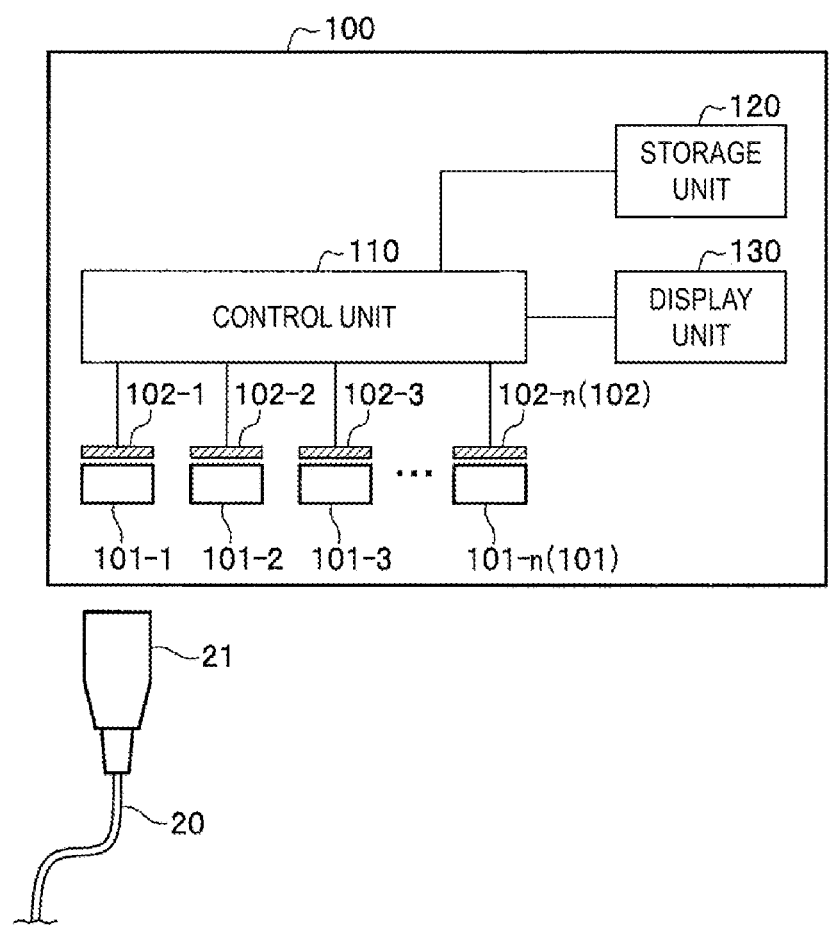
FIG. 1 is a functional block diagram schematically illustrating an incorrect insertion and removal prevention system according to a first embodiment of the present invention.

FIG. 1 is a functional block diagram schematically illustrating an incorrect insertion and removal prevention system according to a first embodiment of the present invention. In this example, the incorrect insertion and removal prevention system according to the embodiment is applied to the insertion and removal of an optical fiber cable of an optical transmission device. This system can be applied to electronic devices other than the optical transmitting device.

As illustrated in FIG. 1, an optical transmission device 100 (incorrect insertion and removal prevention system; electronic device) includes a plurality of ports 101-1, 101-2, . . . , 101-*n* (n is any natural number) (input and output ports) located on a front face of a cabinet 100A (see FIG. 2), touch sensors 102-1, 102-2, . . . , 102-*n* installed in the respective ports 101-1, 101-2, . . . , 101-*n*, a control unit 110, a storage unit 120, and a display unit 130.

Note that when the ports 101-1, 101-2, . . . , 101-*n* are not particularly distinguished, the ports are collectively referred to as ports 101. When the touch sensors 1024, 102-2, . . . , 102-*n* are not specifically distinguished, the touch sensors are collectively referred to as touch sensor 102.

The ports 101 is input and output ports for transmitting and receiving external signals.

A connector 21 (conductive component) provided at an end of an optical fiber cable 20 (hereinafter referred to as cable 20) is inserted into the port 101.

A socket portion (outline portion) of the connector 21 is made of a conductive material such as conductive plastic. However, the socket portion of the connector 21 may be made of a non-conductive material such as resin mold or plastic.

The touch sensor 102 is installed in each port 101 to detect a finger (human body) or the connector 21 directly touching the port. In the present embodiment, contact of the connector 21 (conductive material) is also detected. Thus, a capacitive touch sensor that detects a change in capacitance is used as the touch sensor 102.

Note that the touch sensor 102 may be a resistive film-type (pressure sensitive-type) sensor. Note that, the resistive film-type touch sensor has a simple structure, is low in cost, and is resistant to dusts and water droplets due to a surface-coating film.

The control unit 110 displays, on the display unit 130, information about a port 101 corresponding to a touch sensor 102 that has detected the contact with the human body.

Specifically, when the touch sensor 102 detects a finger touch, the control unit 110 acquires the corresponding port number from the storage unit 120, and displays the port number on the display unit 130. The control unit 110 is controlled to be updated each time an input to the touch sensor 102 is made, and when no input to the touch sensor 102 is made, automatically turned off after an elapse of a certain time. When detecting information about the plurality of adjacent sensors, the control unit 110 controls the display unit 130 so as not to perform display.

The storage unit 120 stores information (e.g., port number) for distinguishing each port 101.

The display unit 130 displays hue information (e.g., port number) for distinguishing each port 101.

Figure 2:
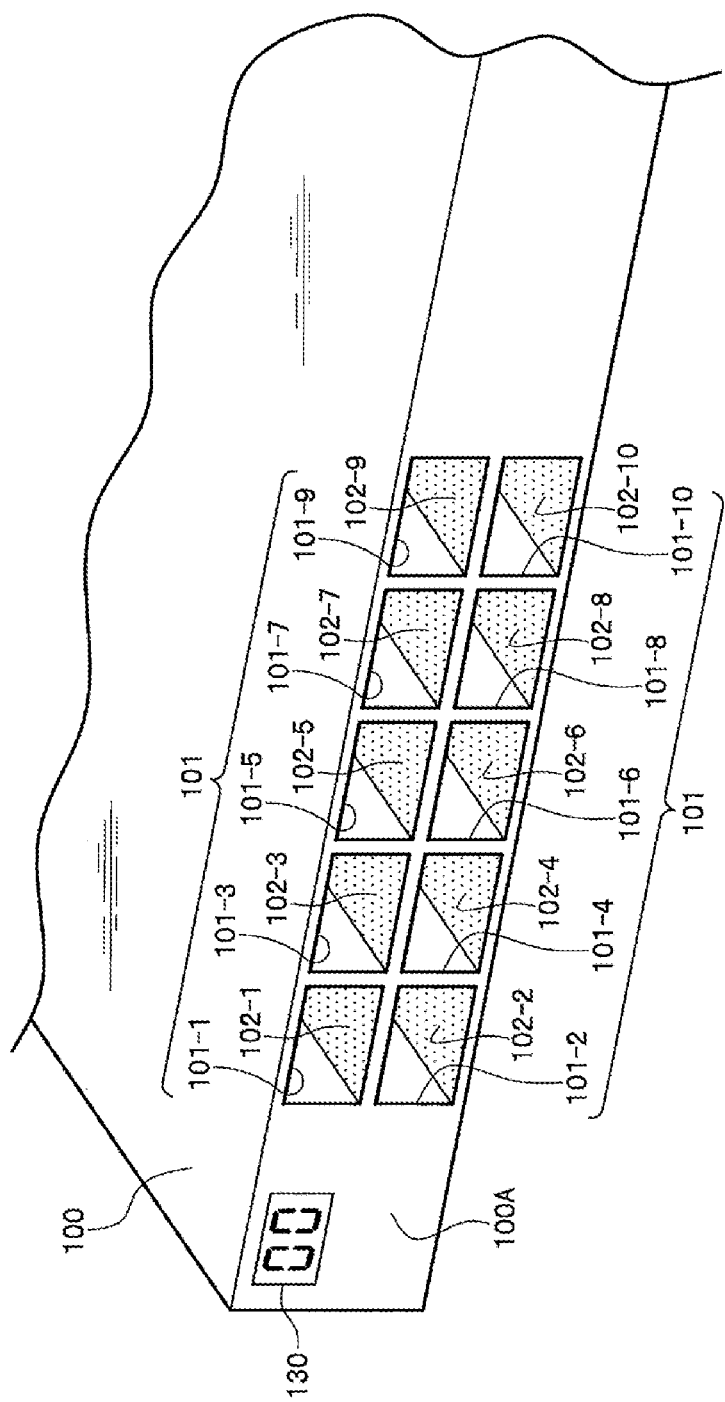
FIG. 2 is a perspective view illustrating a physical implementation of an electronic device of the incorrect insertion and removal prevention system according to the present embodiment.

FIG. 2 is a perspective view illustrating a physical implementation of the optical transmission device 100.

As illustrated in FIG. 2, the optical transmission device 100 has a cabinet 100A and a side face of the cabinet 100A (here, a front face that is easily visible by the operator) is provided with the plurality of ports 101-1, 101-2, . . . , 101-10 laterally arranged in upper and lower rows. The touch sensors 102-1, 102-2, . . . , 102-10 are provided in the ports 101-1, 101-2, 101-10, respectively.

In addition, the display unit 130 is installed on an upper left corner of the front face of the cabinet 100A.

The ports 101 are disposed on the front face of the cabinet 100A of the optical transmission device 100, and are targets of the insertion and removal operations performed by the operator.

Each of touch sensors 102 is disposed on an inner bottom portion of the corresponding port 101. The touch sensor 102 is integrated with the inner bottom portion of the port 101, and reacts to a finger or the like touching the inner bottom portion of the port 101 from the front.

The display unit 130 is a liquid crystal display, an LED number indicator, or the like. The display unit 130 is located at an easy-to-see position of the front face such that the operator can recognize displayed contents, for example, at the upper left corner of the front face of the cabinet 100A. Note that, in FIG. 2, all of the ports 101 are in an untouched state, and thus, the display unit 130 displays "00" indicating that all of the ports 101 are in the non-contact state.

Next, touch detection of the touch sensor 102 will be described with reference to FIG. 3 and FIG. 4.

Figure 3:
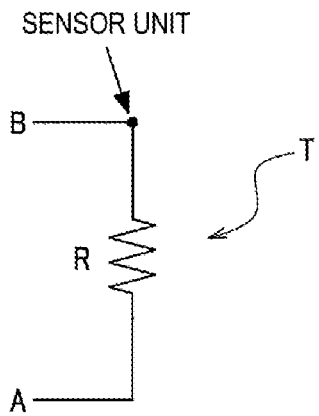
FIG. 3 are schematic views of a touch detection circuit T of the incorrect insertion and removal prevention system according to the present embodiment in an untouched state, FIG. 3(*a*) is a circuit diagram of the touch detection circuit T, FIG. 3(*b*) is a waveform chart illustrating a pulse waveform output from a terminal A of the circuit in FIG. 3(*a*), and FIG. 3(*c*) is a waveform chart illustrating a pulse waveform output from a terminal B of the circuit in FIG. 3(*a*).
Figure 3:
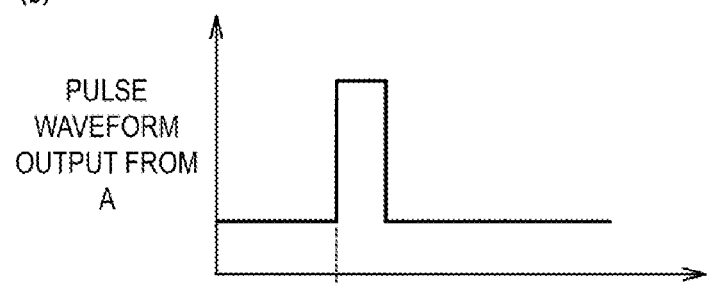
Figure 3:
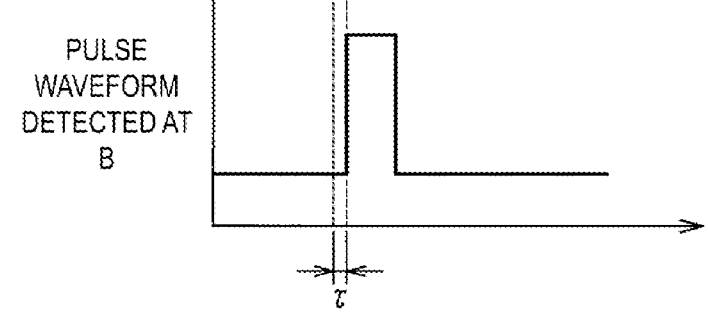

FIG. 3 are schematic diagrams of a touch detection circuit T in the untouched state, FIG. 3(a) is a circuit diagram of the touch detection circuit T, FIG. 3(b) is a waveform chart illustrating a pulse waveform output from a terminal A of the circuit in FIG. 3(a), and FIG. 3(c) is a waveform chart illustrating a pulse waveform output from a terminal B of the circuit in FIG. 3(a).

The touch sensor 102 (see FIG. 2) operates while receiving power supply from a power source not illustrated, and detects a change in the capacitance of the terminal B of the touch detection circuit T illustrated in FIG. 3(a), R is a circuit resistance of the touch detection circuit T.

The touch detection circuit T uses a circuit that reads the time constant change of an RC circuit. When the touch detection circuit T in the untouched state detects, at the terminal B, an electrical pulse transmitted from the terminal A, a rise time (here, 90% rise time) τ is a very small value.

Figure 4:
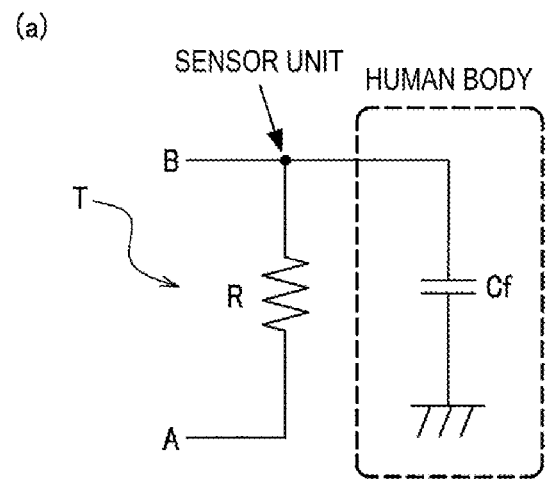
FIG. 4 are schematic views of the touch detection circuit T of the incorrect insertion and removal prevention system according to the present embodiment in a touched state, FIG. 4(*a*) is a circuit diagram of the touch detection circuit T, FIG. 4(*b*) is a waveform chart illustrating a pulse waveform output from a terminal A of the circuit in FIG. 4(*a*), and FIG. 4(*c*) is a waveform chart illustrating a pulse waveform output from a terminal B of the circuit in FIG. 4(*a*).
Figure 4:
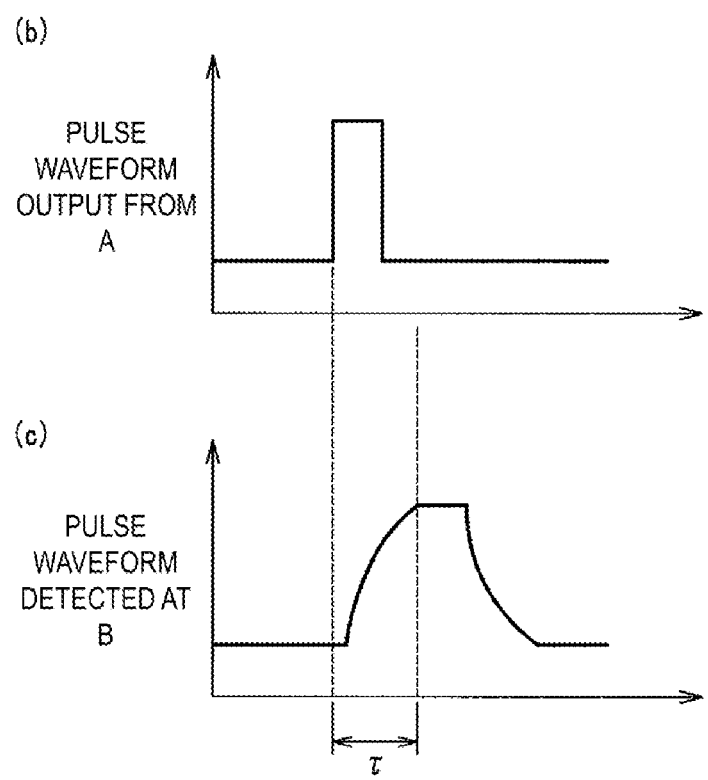

FIG. 4 are schematic diagrams of the touch detection circuit 'I' in the touched state, FIG. 4(a) is a circuit diagram of the touch detection circuit T, FIG. 4(b) is a waveform chart illustrating a pulse waveform output from a terminal A of the circuit in FIG. 4(a), and FIG. 4(c) is a waveform chart illustrating a pulse waveform output from a terminal B of the circuit in FIG. 4(a). As illustrated in FIG. 4(a), the human body is a dielectric and has a capacitance Cf. When the human body touches the touch sensor 102 (see FIG. 2), the touch detection circuit T detects the capacitance Cf between the touch sensor 102 and the ground.

As illustrated in FIG. 4(a), the touch detection circuit T in the touched state forms an RC circuit with the capacitance Cf of the human body, and as illustrated in FIG. 4(c), detects a pulse rise at the terminal B with a delay.

The capacitance Cf of the human body is said to be about 100 pF. Given that the circuit resistance R of the touch detection circuit T is 10 MΩ, the time constant RC of the touch detection circuit T is 100 pF×10 MΩ=1 msec. Since the 90% rise time is approximately 2.2 times the time constant RC, τ is 2.2 msec. This delay enables the touch sensor 102 to detect a touch.

Figure 6:
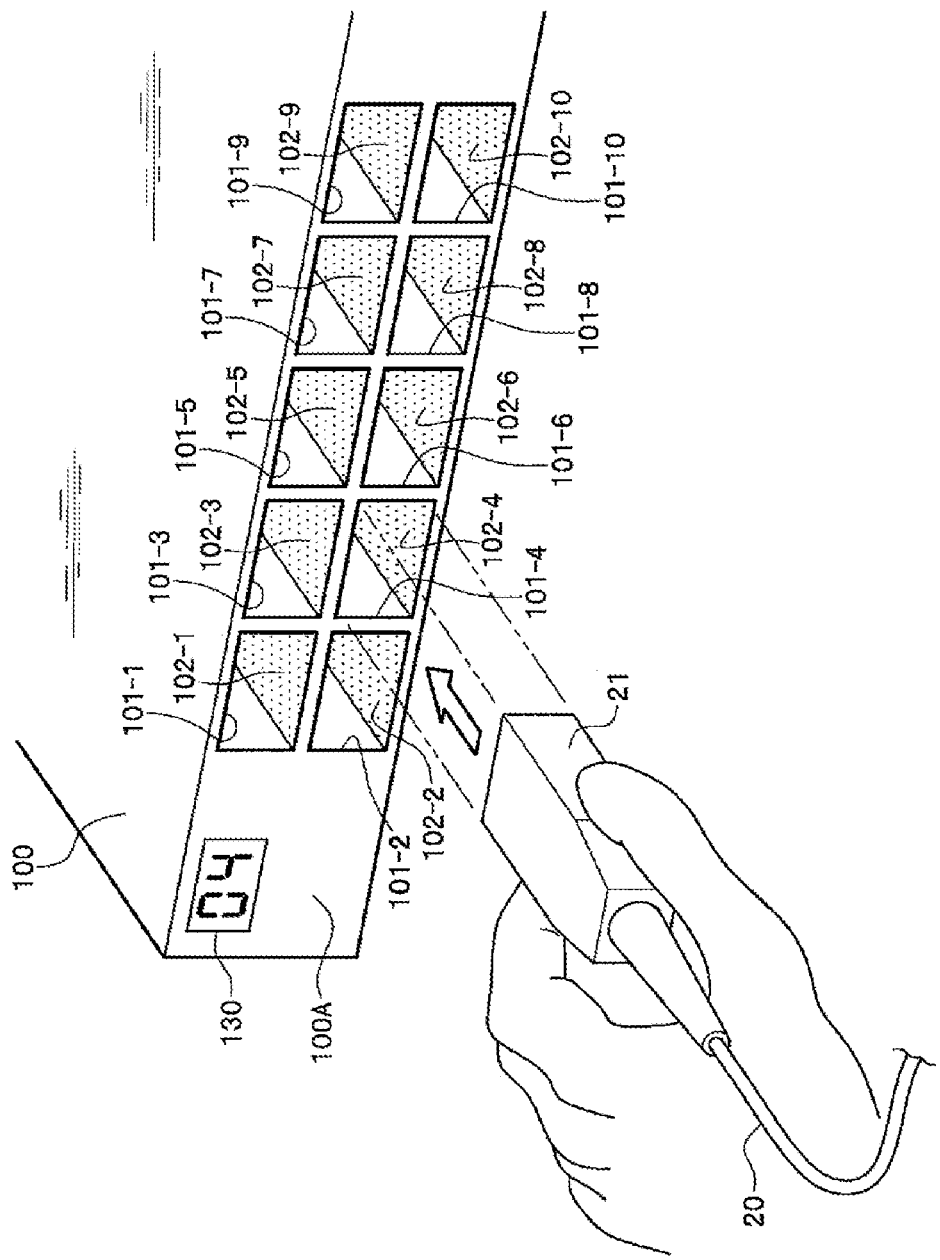
FIG. 6 is a diagram illustrating a second usage of incorrect insertion and removal prevention for the electronic device of the incorrect insertion and removal prevention system according to the present embodiment.
Figure 7:
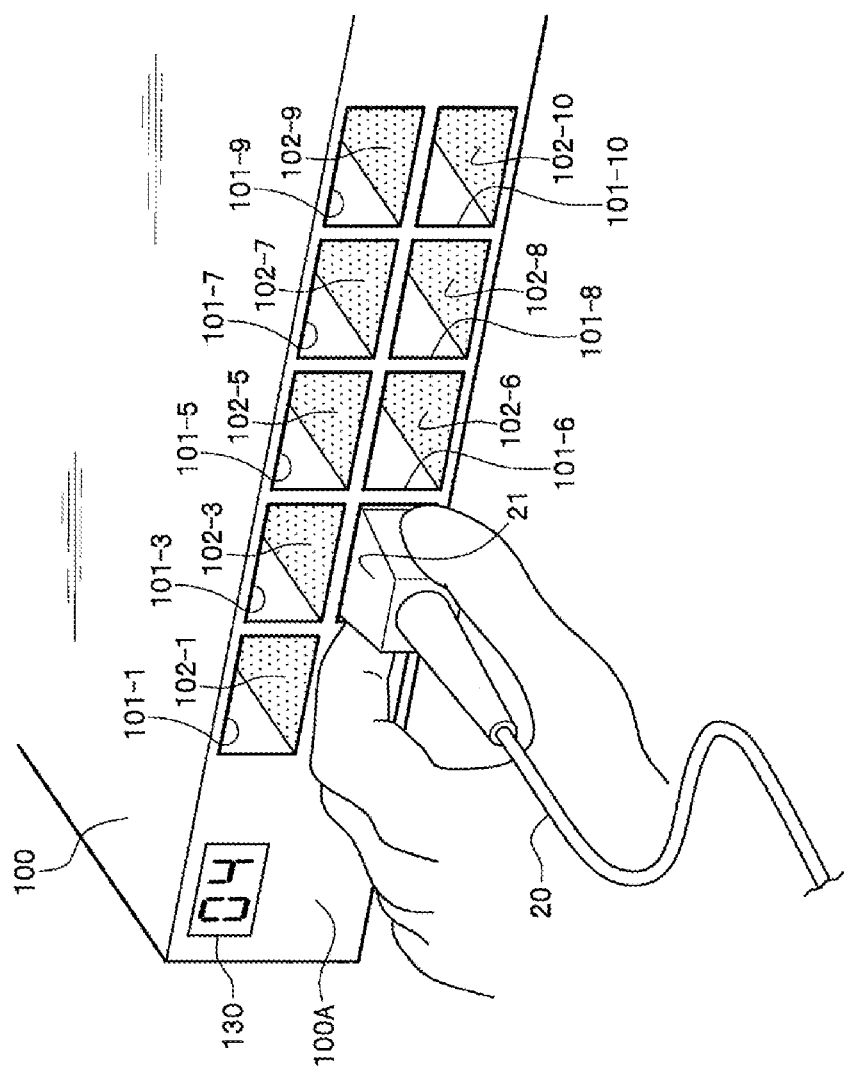
FIG. 7 is a diagram illustrating a third usage of incorrect insertion and removal prevention for the electronic device of the incorrect insertion and removal prevention system according to the present embodiment.

The touch sensor 102 can detect a touch when touched via a grip, instead of being touched directly, by the human body as well (see FIGS. 6 and 7). However, in this case, the grip is formed of a conductor, and has the same potential as the sensor portion (touch electrode) of the touch sensor 102. If not, the grip needs to be designed to have a high capacitance by disposing a conductor near the grip, for example.

The reasons for this are as follows.

When the grip is present, a capacitance Ct detected in place of the capacitance Cf of the human body is a series connection capacitance of the capacitance Cf of the human body and the capacitance Cm of the grip, and can be calculated according to an equation (1).

$$(1/Ct)=(1/Cf)+(1/Cm) \quad (1)$$

When the grip is a conductor such as metal, the Cf is considered to be infinite and Ct becomes equal to Cm. Thus, detection can be made in the same manner as the touch detection circuit T illustrated in FIG. 4(a).

On the contrary, when the grip is an insulator and the human body touches via the insulator, the capacitance Cm of the grip is extremely small. Assuming that the relative dielectric constant of typical plastic materials is 3, the area touching the human body is 1 cm², and the distance from the position where the grip has the same potential as the sensor portion to the human body is 1 cm, Cm is expressed by a equation for the capacitance (2). According to the equation (2), the capacitance Cm is calculated to be about 0.25 pF.

$$C=\varepsilon 0 \times r \times S/d \quad (2)$$

ε0: Permittivity of vacuum
εr: Relative dielectric constant of material
S: Electrode area
d: Inter-electrode distance Substituting Cf=100 pF and Cm=0.25 pF into the above equation (1) results in Ct≈0.25 pF, which is substantially the same value as Cm. This capacitance is deemed to be at the same level as a parasitic capacitance in the touch detection circuit T, and the delay τ is difficult to distinguish from the untouched state, and thus is difficult to detect. Moreover, the value may easily become much smaller depending on how it is gripped, for example, change of the gripping position. Thus, the case above is not practical.

In light of the foregoing, the grip is preferably made of a conductive material. In the embodiment, the grip is the connector 21 (see FIG. 2), and the connector 21 is made of a conductive material. Thus, the touch sensor 102 can detect a contact of the human body (finger) as well as the connector 21.

Hereinafter, incorrect insertion and removal preventing operations of the electronic device used in the incorrect insertion and removal prevention system configured as described above will be described.

The basic operation is as follows.

As illustrated in FIG. 1, the control unit 110 detects a touch on the touch sensor 102. When a touch is made on the touch sensor 102, the control unit 110 acquires the number of the port corresponding to the touch sensor 102 from the storage unit 120. The control unit 110 causes the display unit 130 to display the port number acquired from the storage unit 120. The control unit 110 updates the display on the display unit 130 each time an input (touch) to the touch sensor 102 is newly made. When no input is made to the touch sensor 102 for a certain time or longer, the control unit 110 controls the display unit 130 to turn off the display after an elapse of a certain time.

In addition, when detecting simultaneous inputs to the plurality of touch sensors 102, the control unit 110 does not perform display regarding any touch sensor 102. The operator may possibly touch the plurality of adjacent touch sensors 102. In such a case, the control unit 110 performs control not to perform display in order to avoid confusion.

Next, a specific usage will be described.

Figure 5:
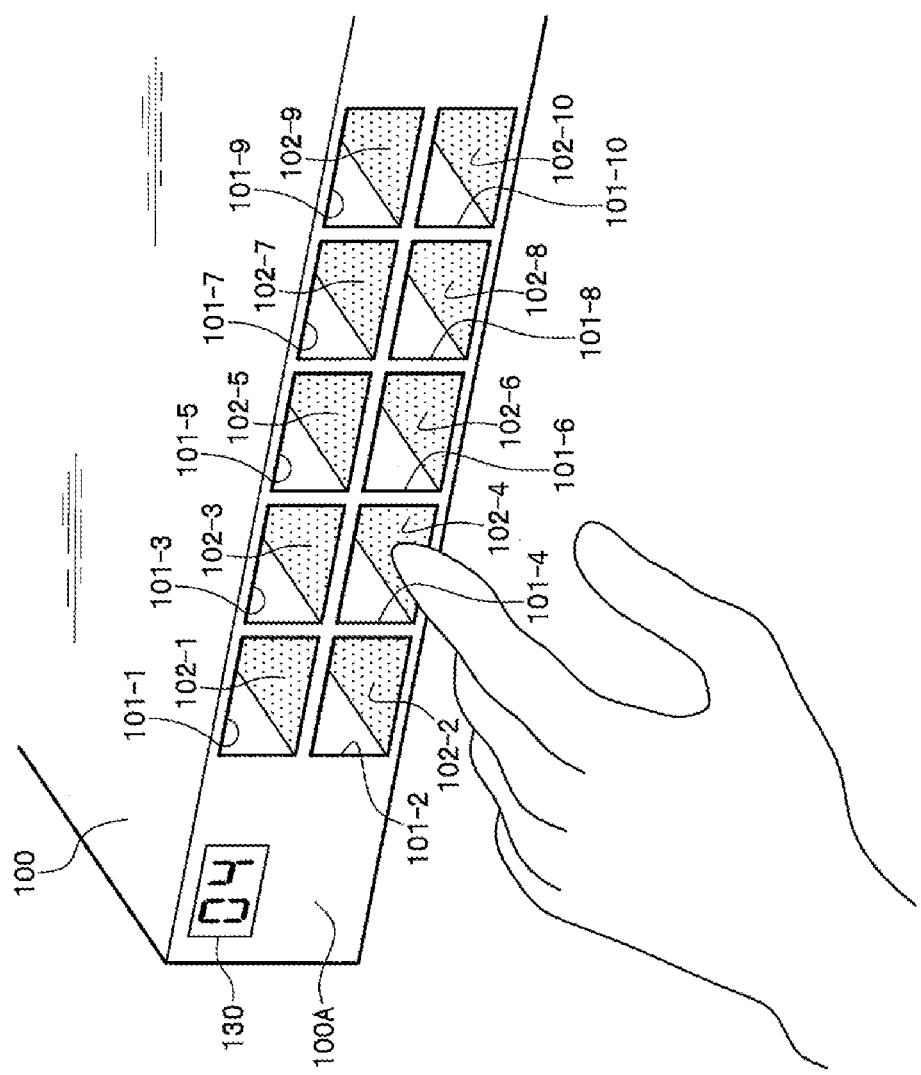
FIG. 5 is a diagram illustrating a first usage of incorrect insertion and removal prevention for the electronic device of the incorrect insertion and removal prevention system according to the present embodiment.

FIG. 5 is a diagram illustrating a first usage for incorrect insertion and removal prevention for the electronic device. The operator attempts to insert the connector 21 (see FIG. 1) into the port 101-4.

As illustrated in FIG. 5, the operator touches the port to be operated (here, the port 101-4) with a finger. When a touch is made on the touch sensor 102-4 in the port 101-4, the control unit 110 acquires the number "04" of the port 101-4 corresponding to the touch sensor 102-4 from the storage unit 120. The control unit 110 causes the display unit 130 to display the number "04" of the port 101-4 acquired from the storage unit 120.

This enables the operator to confirm the port number "04" of the port 101-4 to be operated. In this manner, the position of the port can be confirmed without the risk of misidentifying the order of the ports or miscounting from the end. Thus, misconnections can be avoided.

FIG. 6 is a diagram illustrating a second usage of incorrect insertion and removal prevention for the electronic device. The operator attempts to insert the connector 21 into the port 101-4. The connector 21 is made of a conductive material and corresponds to the grip described above.

As illustrated by the outlined arrow in FIG. 6, the operator grips the connector 21, and touches the port to be operated (here, the port 101-4) with a tip of the connector 21. When the tip of the connector 21 touches the touch sensor 102-4 in the port 101-4, the touch sensor 102-4 detects a change in capacitance due to the connector 21 and the human body, and outputs a detection signal to the control unit 110. Here, the connector 21 is made of a conductive material and has the same potential as the touch sensor 102. The control unit 110 acquires the number "04" of the port 101-4 corresponding to the touch sensor 102-4 from the storage unit 120. The control unit 110 causes the display unit 130 to display the number "04" of the port 101-4 acquired from the storage unit 120.

In this way, the number "04" of the port 101-4 to which the connector 21 is applied is displayed in the display unit 130. When the operator applies the connector 21 to the port, the number of the port is displayed on the display unit 130. Thus, the operator confirms that the port is a correct port and then, pushes the connector 21 into the port 101-4 as it is, thereby completing the connection.

Note that in the first usage described above, when the operator looks away, for example, while taking the cable 20, there is a risk of losing sight of the confirmed port, but the second usage eliminates such concern.

FIG. 7 is a diagram illustrating a third usage of incorrect insertion and removal prevention for the electronic device. The third usage is the operation of removing the connector 21.

The operator attempts to remove the connector 21 from the port 101-4.

FIG. 7 illustrates the state in which the operator touches the connector 21 of the connected cable 20. In this case as well, the touch sensor 102-4 detects a change in capacitance caused by a contact of the human body via the connector 21, and outputs the detection signal to the control unit 110. The control unit 110 causes the display unit 130 to display the number "04" of the port 101-4 acquired from the storage unit 120.

The operator may grip the connector 21 to visually recognize the number "04" of the port corresponding to the display unit 130. The operator can confirm that the gripped connector 21 is the connector of the cable connected to the correct port. In the case of the correct port number, the operator removes the cable as it is. This can prevent a wrong cable from being removed.

Modification Examples

Figure 8:
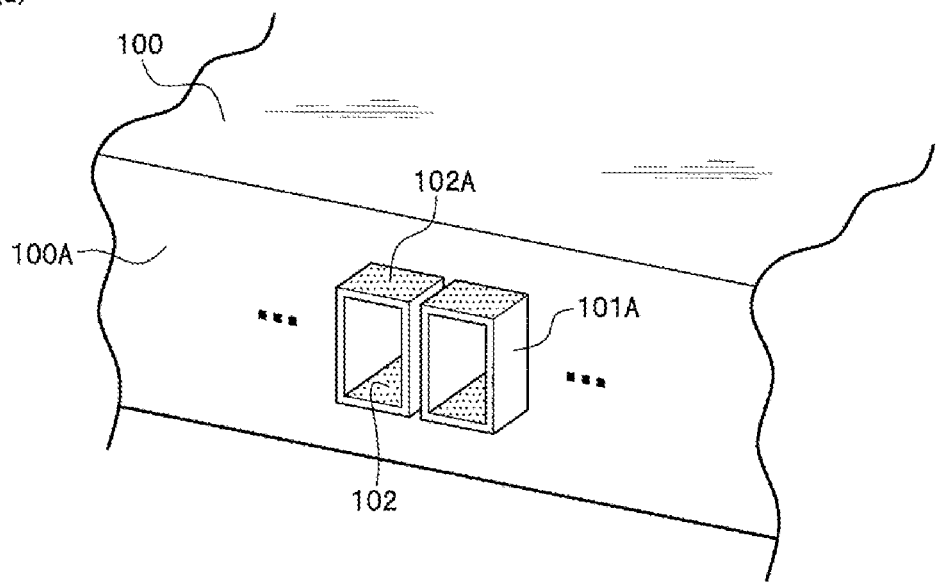
FIG. 8 are perspective views illustrating modified examples of ports of the electronic device of the incorrect insertion and removal prevention system according to the present embodiment, FIG. 8(*a*) is a perspective view illustrating a modification example 1, and FIG. 8(*b*) is a perspective view illustrating a modification example 2.
Figure 8:
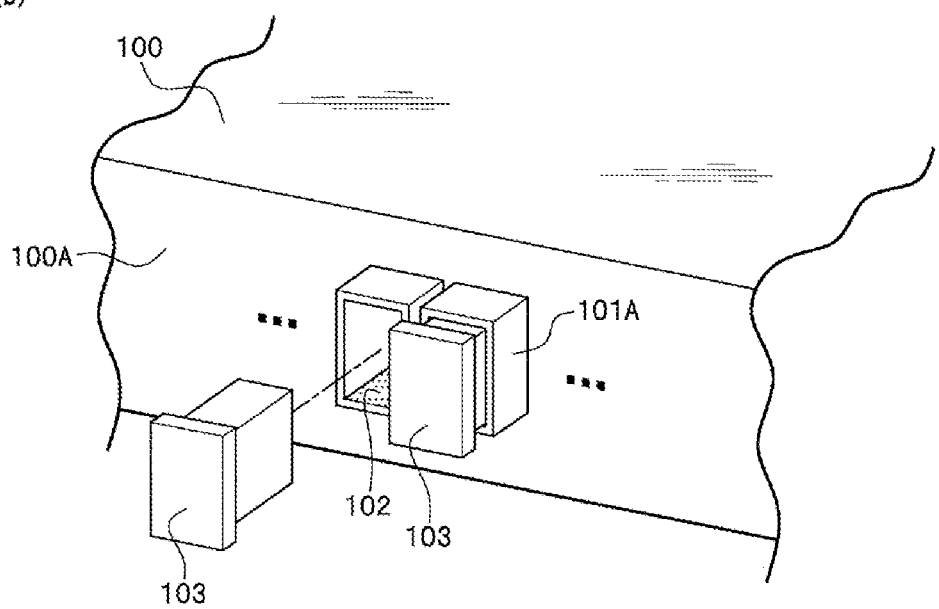

FIG. 8 are perspective views illustrating modified examples of ports of the optical transmission device 100.

As illustrated in FIG. 8(*a*), ports 101A protruding from a front face of the cabinet 100A are arranged on the front face. Each port 101A is cuboid, a touch sensor 102 is disposed on an inner bottom portion of the cuboid port 101A, and a touch sensor 102A is disposed on a top face of the cuboid port 101A. That is, the port 101A has the touch sensor 102 disposed at the inner bottom portion and the touch sensor 102A disposed on the top face. The touch sensor 102A has a similar configuration to the touch sensor 102.

This modification example is effective in the case where the connector inserted into the port 101A is small and accordingly, the inner width of the port 101A is narrow and thus, it is difficult to insert a finger into the port 101A.

As illustrated in FIG. 8(*b*), the touch sensor 102A on the top face is removed from the port 101A in FIG. 8(*a*). Instead, a cap 103 (conductive component) that is made of a conductive material and is attachable to the port 101A is provided. Like the connector 21 (see FIGS. 6 and 7), the cap 103 is made of a conductive material such as a conductive plastic. When attached to the port 101A, the cap 103 contacts the touch sensor 102 in the port 101A.

The operator may cause, via the cap 103, the touch sensor 102 in the port 101A to react by touching the surface of the cap 103.

By using the cap 103 made of the conductive material, the touch sensor 102A illustrated in FIG. 8(*a*) can be omitted.

When attached to an unused port, the cap 103 can also provide a dust-proof function.

Note that the cap 103 illustrated in FIG. 8(b) may be used in the touch sensor 102A illustrated in FIG. 8(a).

Figure 9:
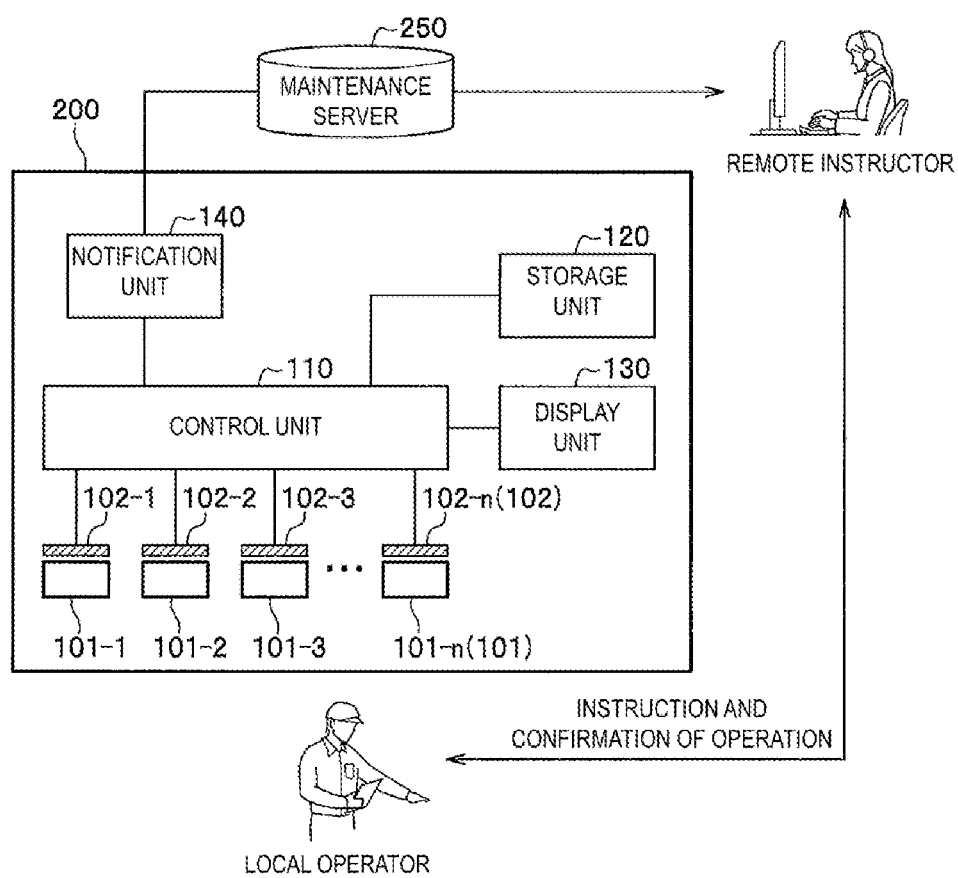
FIG. 9 is a functional block diagram schematically illustrating an incorrect insertion and removal prevention system according to a second embodiment of the present invention.

FIG. 9 is a functional block diagram schematically illustrating an incorrect insertion and removal prevention system according to a second embodiment of the present invention. The same portions as those in FIG. 1 are denoted by the same reference signs, and description thereof is omitted.

As illustrated in FIG. 9, the incorrect insertion and removal prevention system includes an optical transmission device 200 (incorrect insertion and removal prevention system; electronic device), and a maintenance server 250.

The optical transmission device 200 (incorrect insertion and removal prevention system; electronic device) includes a plurality of ports 101-1, 101-2, ..., 101-n disposed on the front face of the cabinet, 100A (see FIG. 2), touch sensors 102-1, 102-2, ..., 102-n installed in the respective ports 101-1, 101-2, ..., 101-n, a control unit 110, a storage unit 120, a display unit 130, and a notification unit 140. The notification unit 140 is connected to the maintenance server 250 (monitor device) in a wired or wireless manner, and notifies the maintenance server 250 of the touch state and the port number recognized by the control unit 110.

The maintenance server 250 manages the touch state and the port number from other electronic devices (not illustrated) including the optical transmission device 200. The maintenance server 250 communicates the touch state and the port number notified from the optical transmission device 200 to a remote instructor in real time.

The remote instructor gives a work instruction/confirmation to the local operator by use of predetermined contact medium (for example, a screen display by a mobile information terminal or a voice through a mobile phone held by the operator).

The instructor can give instructions while confirming whether the operator is working on the correct port in any of the above-mentioned first to third usages. For example, when removing the cable 20 (see FIG. 7), the following is assumed. When the operator grips the connector 21 (see FIG. 7), the operator requests the instructor to make confirmation. The instructor confirms that the touched connector 21 is the cable 20 connected to the correct port to be operated, and issues a removal instruction. The operator removes the gripped cable 20 as it is. In this manner, the local operator and the remote instructor can work in coordination performing double check, thereby reducing incorrect operations.

As described above, the optical transmission device 100 of the incorrect insertion and removal prevention system includes the plurality of ports 101 for transmitting and receiving external signals, touch sensors 102 installed in the respective ports 101 to detect a contact of the human body, the control unit 110 for causing the display unit 130 to display information about the port 101 corresponding to the touch sensor 102 that detects the contact of the human body, the storage unit 120 for storing information for distinguishing each port 101, and the display unit 130 for displaying the information for distinguishing each port 101.

With the configuration described above, the operator can perform the insertion and removal operations on each port 101 while confirming the port to be operated on the display unit 130. Accordingly, even when the mounting density of the port 101 is high and a large number of ports are disposed in one electronic device, human errors, such as the operator connecting the cable to the incorrect port or removing the incorrect cable, can be prevented.

In addition, while realizing the configuration in which multiple ports are arranged, the display unit 130 is disposed at one location on the front face of the cabinet 100A. As a result, the operator can be prevented from incorrectly selecting the port to be operated without sacrificing the port mounting density.

Hitherto, the embodiments of the present invention has been described. However, the present invention is not limited to the above embodiments, and can be appropriately changed in a range without departing from the subject matter of the present invention.

In the present embodiment, the touch portion of the touch sensor 102 is provided on the bottom portion in the port 101 that is easy to touch with a finger, but the invention is not limited thereto, and the touch portion may be provided on the outer circumferential portion or the inner circumferential face of the opening of the port 101.

In the present embodiment, information for distinguishing each input and output port displayed on the display unit 130 is the port number, but the information may be any information that indicates the port to be operated such as a customer code.

In the present embodiment, the display unit 130 is mounted on the cabinet 100A of the optical transmission device 100, but an independent display device may be provided.

In the present embodiment, the cable 20 is connected as an example, but the present invention can also be applied to a storage device such as USB memory or a pluggable module such as a Small Form Factor Pluggable (SFP).

REFERENCE SIGNS LIST

20 Fiber cable (cable)
21 Connector (conductive component)
100, 200 Optical transmission device (incorrect insertion and removal prevention system; electronic device)
100A Cabinet
101, 101-1, 101-2, ..., 101-n Port (input and output port)
102, 102-1, 102-2, ..., 102-n Touch sensor
103 Cap (conductive component)
110 Control unit
120 Storage unit
130 Display unit
140 Notification unit
250 Maintenance server (monitor device)
T Touch detection circuit

The invention claimed is:

1. An incorrect insertion and removal prevention system comprising:
    an electronic device having a plurality of input and output ports for transmitting and receiving an external signal;
    a touch sensor installed along an interior side surface within each of the plurality of input and output ports, the touch sensor being configured to detect a contact of a human body;
    a display unit configured to display information for distinguishing each of the plurality of the input and output ports; and
    a control unit configured to cause the display unit to display the information about the input and output port corresponding to the touch sensor detecting the contact of the human body.

2. The incorrect insertion and removal prevention system according to claim 1, wherein the touch sensor detects the contact of the human body via a conductive component that contacts the human body.

3. The incorrect insertion and removal prevention system according to claim 1, wherein
each of the plurality of the input and output ports of the electronic device is arranged on a face of a cabinet, and
the display unit is disposed on the face of the cabinet.

4. The incorrect insertion and removal prevention system according to claim 1, further comprising:
a monitor device configured to monitor the electronic device; and
a notification unit configured to notify the monitor device of a signal from the touch sensor.

5. The incorrect insertion and removal prevention system according to claim 1, wherein the touch sensor is configured to detect the contact of the human body prior to completing connection of one or more of the plurality of input and output ports to transmit and receive the external signal.

6. The incorrect insertion and removal prevention system according to claim 1, wherein each of the plurality of the input and output ports of the electronic device is a cuboid port and is arranged protruding from a face of a cabinet.

7. The incorrect insertion and removal prevention system according to claim 6, further comprising an additional touch sensor installed along an exposed exterior surface of each of the plurality of input and output ports.

8. The incorrect insertion and removal prevention system according to claim 1, wherein the touch sensor extends within the interior side surface along an insertion direction of the plurality of input and output ports.

9. The incorrect insertion and removal prevention system according to claim 8, wherein the plurality of input and output ports are configured to receive a connector comprising a socket portion along the insertion direction of the plurality of input and output ports.

10. The incorrect insertion and removal prevention system according to claim 1, wherein the touch sensor is integrated with the interior side surface within each of the plurality of input and output ports.

11. The incorrect insertion and removal prevention system according to claim 1, wherein the touch sensor comprises one of a capacitive touch sensor and a resistive film-type sensor.

12. The incorrect insertion and removal prevention system according to claim 11, wherein the resistive film-type sensor comprises a pressure sensitive-type sensor.

13. The incorrect insertion and removal prevention system according to claim 1, wherein the information for distinguishing each of the plurality of the input and output ports includes one of a port number and a customer code.

* * * * *